United States Patent [19]
Balog et al.

[11] Patent Number: 5,669,970
[45] Date of Patent: Sep. 23, 1997

[54] STENCIL APPARATUS FOR APPLYING SOLDER PASTE

[75] Inventors: Robert J. Balog, North Attleboro, Mass.; David P. Prince, Wakefield, R.I.

[73] Assignee: MPM Corporation, Franklin, Mass.

[21] Appl. No.: 458,710

[22] Filed: Jun. 2, 1995

[51] Int. Cl.⁶ ........................ B05C 1/00
[52] U.S. Cl. .............. 118/213; 118/301; 118/406; 101/127; 101/126; 101/127.1; 101/128; 101/128.1; 101/128.21; 101/128.4
[58] Field of Search .................. 118/213, 301, 118/406; 101/127, 128.1, 128.4, 128, 128.21, 126, 127.1; 427/272, 282

[56] References Cited

U.S. PATENT DOCUMENTS

| | | |
|---|---|---|
| Re. 34,615 | 5/1994 | Freeman . |
| 5,522,929 | 6/1996 | Erdmann ................ 118/213 |

FOREIGN PATENT DOCUMENTS

| | | | |
|---|---|---|---|
| 268708 | 3/1981 | U.S.S.R. | ............... 101/129 |
| 907635 | 2/1982 | U.S.S.R. | . |

*Primary Examiner*—Donald E. Czaja
*Assistant Examiner*—Michael Philip Colaianni
*Attorney, Agent, or Firm*—Wolf, Greenfield & Sacks, P.C.

[57] ABSTRACT

A stencil for applying solder paste in a desired pattern for mounting electronic components on a surface of a circuit board, said stencil including a sheet having holes therethrough in a pattern corresponding to the desired pattern, a smooth upper surface for receiving the solder paste thereon, and a smooth lower surface for contacting the surface of the circuit board, the upper surface having relieved portions so as to increase the friction between the upper surface and the solder paste being squeegeed thereover.

25 Claims, 1 Drawing Sheet

STENCIL APPARATUS FOR APPLYING SOLDER PASTE

BACKGROUND OF THE INVENTION

The invention relates to a stencil used in applying solder paste in a desired pattern for mounting electronic components on a surface of a circuit board.

Electronic components can be mounted on the surfaces of circuit boards using solder paste deposited in a desired pattern on the board to make electrical connection to conductors of the components upon heating of the solder.

The solder paste can be applied in the desired pattern on the surface of the circuit board using a stencil that has holes in the same pattern. A squeegee blade is used to wipe the solder across the upper surface of the stencil so that the solder fills the holes and contacts the portions of the circuit board surface at the holes. In order to completely fill the holes with solder, it is desired for the solder moving in front of the blade to develop a rolling action and to be forced down into the openings as the solder moves thereover. If the speed of the squeegee blade is increased beyond a certain value, there may be a loss of rolling action; in its place there can be "slipping" of the solder across the upper surface of the stencil, with the result that the openings may not be completely filled.

SUMMARY OF THE INVENTION

The invention features, in general, a stencil used to apply solder paste in a desired pattern for mounting electronic components on the surface of a circuit board. The stencil is made of a sheet that has holes through it in a pattern corresponding to the desired solder pattern and has a smooth upper surface. The upper surface has relieved portions in it so as to increase the friction between it and the solder paste that is squeegeed thereover with a squeegee blade. The increase in friction permits one to maintain the rolling action of the solder and good filling of stencil holes at the same time that one increases the speed of travel of the squeegee blade.

In preferred embodiments, the relieved portions are lines (straight lines or curved lines), and the lines end short of the openings in order to provide a clearance for good sealing between the blade and the surface around the openings. Preferably, straight lines are used, and they make angles of greater than 60° with an axis along the direction of travel of the squeegee blade (the "stroke axis"). Preferably the angle is between 70° and 80°. The use of angled lines limits the risk of the blade achieving a washboard effect that otherwise might exist if the lines were perpendicular to the direction of movement, assuming that the blade is oriented perpendicular to the stroke axis. If the blade itself is oriented at other than perpendicular to the stroke axis, then the lines should be oriented so that they are not parallel to the blade axis. The blade axis may, for example, be oriented between 75° and 105° with respect to the stroke axis. The line pattern extends beyond the width of the blade in order to guarantee the desired increased-friction effect throughout the entire length of the blade. Preferably the lines converge. The relieved portions can be provided by etching. Preferably, the lines are between about 0.003" and 0.007" (most preferably about 0.005") wide, between 0.0005" and 0.003" deep (most preferably about 0.001"), but not greater than one-half the thickness of the sheet, and are spaced between ⅛" and ⅜". Where the electronic components have solder patterns around the perimeter of the components and define areas inside the perimeter area, the relieved portions continue into the interior areas.

Other advantages and features of the invention will be apparent from the following description of a particular embodiment thereof and of the claims.

DESCRIPTION OF A PARTICULAR EMBODIMENT

Figure 1:
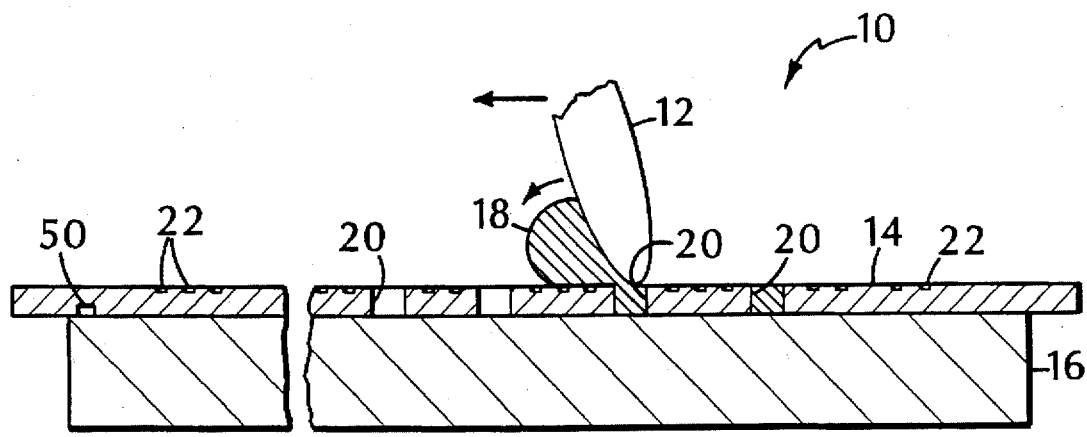
FIG. 1 is a diagrammatic sectional view showing a apparatus for apply solder in a desired pattern on a circuit board.
Figure 2:
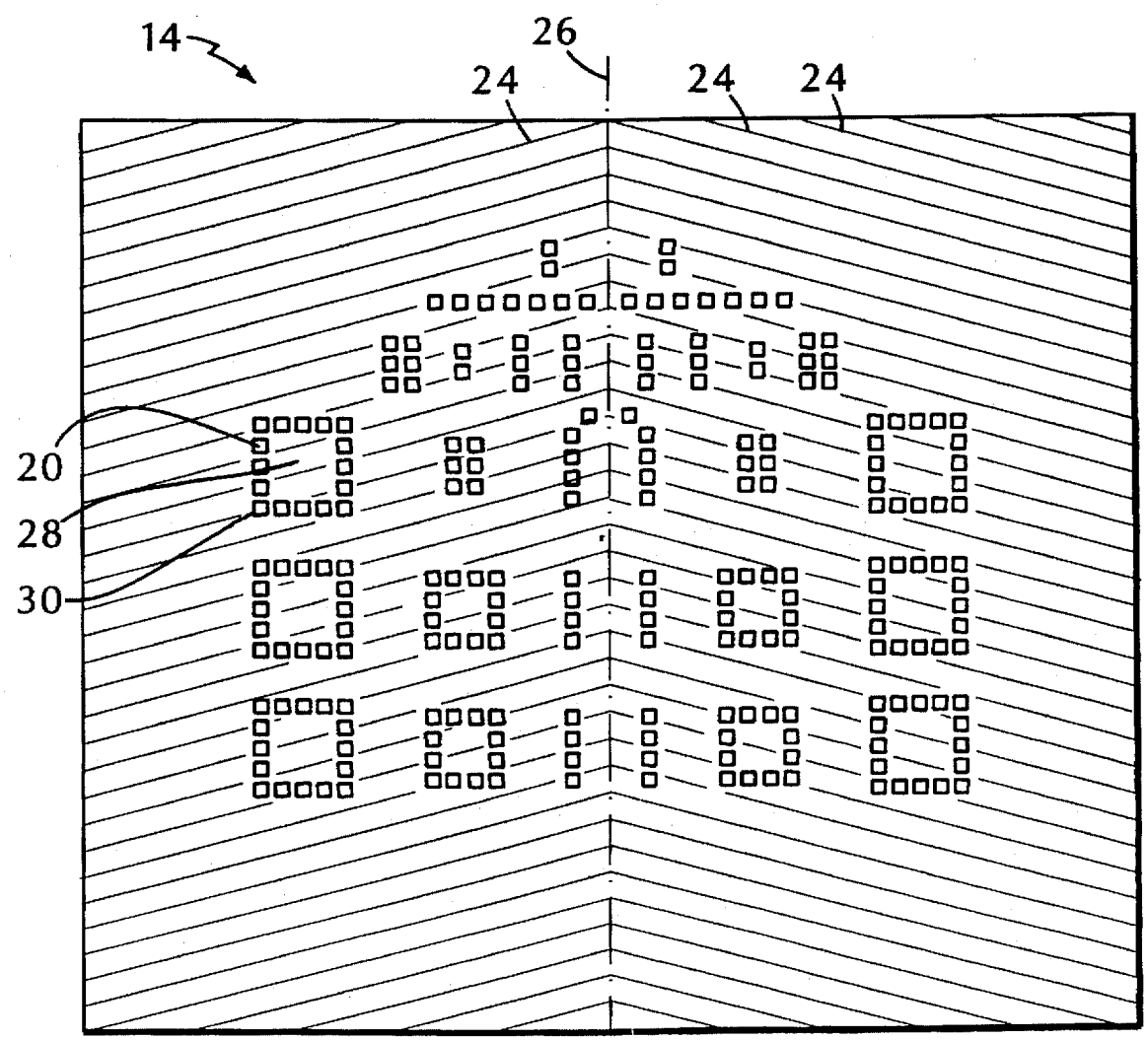
FIG. 2 is a plan view of a stencil of the FIG. 1 apparatus.

Referring to the drawings, there is shown apparatus 10 for applying solder paste in a desired pattern for mounting electronic components on the surface of circuit board 16. The apparatus includes squeegee blade 12 and stencil 14 and is shown over circuit board 16 on which the solder paste 18 is being applied through openings 20.

Openings 20 are in the same pattern as the pattern desired for applying solder to circuit board 16. Stencil 14, which is made of 0.005" thick of a metal such as stainless steel, has relieved portions 22 which are in the form of converging lines 24 disposed at angles of 75° to squeegee stroke axis 26 along which squeegee blade 12 moves. Apparatus 10 preferably is a machine as described, e.g., in Freeman U.S. Pat. No. Re. 34,615, which is hereby incorporated by reference.

Relieved portions 22, which are provided by chemical etching, are 0.005" wide, are 0.001" deep, and are spaced by ¼". Stencil 14 is supported at its edges by a frame (not shown).

Apparatus 10 also includes a mechanism shown generally by 11 in FIG. 1 for supporting the circuit board 16 and stencil 14 and for driving squeegee blade 12. Lines 24 end short of openings 20 and provide a 0.050" clearance therewith in order to provide good sealing action of the squeegee blade and the upper surface of stencil 14 around openings 20. Lines 24 also exist within interior region 28 inside of perimeter region 30 for a component that has solder pads extending all the way around its perimeter.

In use, the circuit board and stencil are mounted in the apparatus, and solder is applied to the upper surface of stencil 14. Squeegee blade 12 then moves across the upper surface along squeegee stroke axis 26. Solder 18 rolls in front of the blade as indicated in FIG. 1, and, as the solder passes over openings 20, the rolling action assists in causing the solder to completely fill the openings 20. The use of the relieved portions 22 increases the friction between the surface and the solder, thereby facilitating maintenance of a rolling action of solder 18 at increased squeegee blade velocity. This permits one to increase blade velocity and still maintain the complete filling of the holes. The increased squeegee blade speed permits one to increase the throughput and efficiency of apparatus 10.

Relieved lines 24 are provided at an angle other than a perpendicular angle to squeegee stroke axis 26 in order to avoid the washboard effect that would occur if the lines were perpendicular to stroke axis 26 and thus parallel to the blade axis, assuming that the blade is oriented perpendicular to the stroke axis. If the blade itself is oriented at other than perpendicular to the stroke axis, then the lines should be oriented so that they are not parallel to the blade axis. The blade axis may be such that the lines 24 are at an acute angle to the blade axis, for example between 10° and 30°. If the blade axis is parallel to the lines, the blade edge could drop into the lines and potentially cause vibration and a loss of seal and deterioration of filling of openings 20 with solder.

By having the lines converge, the solder can be directed to the central area of the board for single-direction, single-blade squeegee action. For two-direction squeegeeing (using either two-blades, one on each side of the solder, or a single blade that is lifted over the solder when changing direction), the solder paste is initially directed inwardly during one pass and outwardly during the other, providing a desirable kneading action. Alternatively, one can simply have lines angled with respect to the blade axis without converging, whether the blade axis is perpendicular to the stroke axis or not, and have two-direction squeegeeing with alternating left and right kneading.

Other embodiments of the invention are within the scope of the following claims, e.g., other line patterns can be used and other types of relieved portions can be used to increase the friction. The lines can be provided by techniques other than etching (e.g., they can be laser cut) and can have different widths, depths, and spacing, and patterns. Where fiducials are etched into the bottom of the stencil, it is desirable that the surface etching be less than half the thickness of the stencil in order to avoid providing a through hole at the fiducial marking. Where fiducials (e.g., fiducial 50) are etched into the bottom, top, or both bottom and top of the stencil, it is desirable that the surface etching be adjusted or held back to avoid impeding the intended function of the fiducial markings.

What is claimed is:

1. A stencil for applying solder paste in a desired pattern for mounting electronic components on a surface of a circuit board, said stencil comprising a sheet having holes therethrough in a pattern corresponding to said desired pattern, a smooth upper surface for receiving said solder paste thereon, and a lower surface for contacting said surface of said circuit board, said upper surface having relieved portions so as to increase the friction between said upper surface and said solder paste being squeegeed thereover.

2. The stencil of claim 1 wherein said relieved portions are in the form of relieved lines.

3. The stencil of claim 2 wherein said lines include straight lines.

4. The stencil of claim 2 wherein said lines include curved lines.

5. The stencil of claim 2 wherein said lines end at a distance spaced from said holes to permit a good sealable contact between a squeegee blade and portions of said upper surface around said holes.

6. The stencil of claim 5 wherein said lines end at least 0.05 inches away from said holes.

7. The stencil of claim 2 wherein said stencil has fiducial marks, and said lines end at least 0.05 inches away from said fiducials.

8. The stencil of claim 1 wherein some of said holes are in a perimeter pattern corresponding to an outside edge of an electronic component on said circuit board, said perimeter pattern defining a closed region, said relieved portions being located both inside of said perimeter pattern and outside of said perimeter pattern.

9. The stencil of claim 3 wherein said stencil has a squeegee stroke axis in the direction of squeegee movement, and wherein said lines are at an acute angle to said squeegee stroke axis.

10. The stencil of claim 9 wherein said lines make an angle greater than 60° with said squeegee stroke axis.

11. The stencil of claim 10 wherein said lines make an angle between 70° and 80° with said squeegee stroke axis.

12. The stencil of claim 3 wherein said stencil has a blade axis for a squeegee blade to move over said stencil, and wherein said lines are at an acute angle to said blade axis.

13. The stencil of claim 2 wherein said lines are etched into said upper surface.

14. The stencil of claim 3 wherein said lines are between 0.003 inches and 0.007 inches wide, between 0.0005 inches and 0.003 inches deep, but not greater than one-half the thickness of said sheet, and are spaced between ⅛" and ⅜".

15. The stencil of claim 10 wherein said lines are between 0.003" and 0.007" wide, between 0.0005" and 0.003" deep, but not greater than one-half the thickness of said sheet, and are spaced between ⅛" and ⅜".

16. Apparatus for applying solder paste in a desired pattern for mounting electronic components on a surface of a circuit board, said apparatus comprising a stencil including a sheet having holes therethrough in a pattern corresponding to said desired pattern, a smooth upper surface for receiving said solder paste thereon and a smooth lower surface for contacting said surface of said circuit board, said upper surface having relieved portions so as to increase the friction between said upper surface and said solder paste being squeegeed thereover, a support for said stencil, and a squeegee blade movably mounted with respect to said support for moving along a squeegee stroke axis across said upper surface and squeegeeing solder thereover.

17. The stencil of claim 16 wherein said relieved portions are relieved lines.

18. The stencil of claim 17 wherein said lines include straight lines.

19. The stencil of claim 17 wherein said lines include curved lines.

20. The stencil of claim 17 wherein said lines end at a distance that is spaced from said holes to permit a good sealable contact between said squeegee blade and portions of said upper surface around said holes.

21. The apparatus of claim 16 wherein said stencil is made of metal.

22. The stencil of claim 18 wherein said blade has a blade axis, and wherein said lines are at an acute angle to said blade axis.

23. The stencil of claim 22 wherein said blade axis is other than perpendicular to said stroke axis.

24. The stencil of claim 23 wherein said blade axis makes an angle of between 75° and 105° with said stroke axis.

25. The stencil of claim 22 wherein said acute angle is between 10° and 30°.

* * * * *